(12) United States Patent
Chang

(10) Patent No.: US 7,369,408 B2
(45) Date of Patent: May 6, 2008

(54) SCREWLESS MINI FAN HOLDER

(75) Inventor: Cheng-Chung Chang, Hsi-Chi (TW)

(73) Assignee: Sercomm Corporation, Miaoli (TW)

( * ) Notice: Subject to any disclaimer, the term of this patent is extended or adjusted under 35 U.S.C. 154(b) by 185 days.

(21) Appl. No.: 11/250,809

(22) Filed: Oct. 14, 2005

(65) Prior Publication Data

US 2007/0086162 A1    Apr. 19, 2007

(51) Int. Cl.
*H05K 7/20* (2006.01)
*F28F 7/00* (2006.01)
*H01L 23/34* (2006.01)

(52) U.S. Cl. .................. 361/697; 165/80.3; 165/121; 257/719; 361/710

(58) Field of Classification Search ................ 361/697
See application file for complete search history.

(56) References Cited

U.S. PATENT DOCUMENTS

| | | | |
|---|---|---|---|
| 5,495,392 A * | 2/1996 | Shen .......................... | 361/697 |
| 5,677,829 A * | 10/1997 | Clemens .................... | 361/697 |
| 6,206,087 B1 * | 3/2001 | Nakase et al. ............ | 165/80.3 |
| 6,520,250 B2 * | 2/2003 | Lee et al. .................. | 165/121 |
| 7,004,236 B2 * | 2/2006 | Lee et al. .................. | 165/80.3 |
| 7,038,913 B2 * | 5/2006 | Lee et al. .................. | 361/709 |
| 7,117,932 B2 * | 10/2006 | Ku et al. .................... | 165/121 |
| 7,131,485 B2 * | 11/2006 | Yu et al. .................... | 165/80.3 |
| 2006/0126302 A1 * | 6/2006 | Lee et al. .................. | 361/704 |

* cited by examiner

*Primary Examiner*—Gregory D Thompson

(57) ABSTRACT

A screwless mini fan holder is disclosed. The mount bracket of the fan holder is composed of two clips and four resilient pins projecting from opposite sides of a backplane. The clips are used to couple the fan holder onto the heat sink of a computer. The resilient pins each having a semi-circular ball head are used to attach the mini fan, where one end of each pin is permanently connected to the back side of the backplane, and the other end extends outward at an inclined angle. Such screwless design enables the fan holder without using any mechanical tools. This not only simplifies the assembly of the mini fan in a computer for most computer users, but also allows air flow to be uniformly distributed over the heat sink for maximized heat dissipation.

15 Claims, 6 Drawing Sheets

SCREWLESS MINI FAN HOLDER

BACKGROUND OF THE INVENTION

1. Field of the Invention

The present invention relates to a screwless mini fan holder, in particular to a mount bracket that is able to simplify the fan assembly in a computer without using screws, and yet the screwless structure can prevent vibration of the fan during the fan operation.

2. The Related Art

Heat dissipation is an important issue for modern computer design. The common practice is to use several mini fans in different parts of the computer to create air flow in the internal chamber so as to prevent overheating of high-frequency power components.

A typical conventional mini fan is installed by mounting four mounting screws through four corners of the fan shell. Since an industrial computer usually has several mini fans, the mounting of these fans could be a time-consuming process that considerably slows down the assembly line. Furthermore, mishandling by line workers, such as misfit screws and washed out screw heads may have screws stuck in the screw holes. Situations like these could lead to loosening of the fan during the fan operation or create other problems for the computer fans.

The mini fan producers then introduce a mount bracket to facilitate the mounting of the mini fan. The quadrangular shaped bracket is constructed with four poles at the four corners of a backplane used for coupling the mini fan onto the mount bracket to create a fan subassembly, and four clips on the other side of the backplane for attaching the fan subassembly onto the heat sink or computer chassis. The four poles are matched with the four corner holes on the fan body when the mount bracket is assembled with the mini fan. But the assembled bracket is so close to the heat sink that a large portion of the heat sink situated underneath the fan assembly is physically blocked from normal air circulation, resulting in uneven heat distribution over the heat sink and poor heat dissipation.

In these aspects, the screwless mini fan holder according to the present invention substantially reduces or obviates the limitations and disadvantages of the prior art.

SUMMARY OF THE INVENTION

The primary object of the invention is to provide a screwless mini fan holder that is able to simplify the installation of a mini fan in a computer.

The second object of the invention is to provide a screwless mini fan holder that is securely mounted onto the heat sink or computer chassis to minimize vibration in the fan operation.

The third object of the invention is to provide a screwless mini fan holder that is able to maximize heat dissipation in the internal chamber, so as to prolong the service life of the computer as well as the mini fan.

The fourth object of the invention is to provide a screwless mini fan holder with reduced production and assembling costs.

To attain the above-mentioned objects, the screwless mini fan holder is actually a mount bracket with a large pilot hole in the center of a backplane, through which air flow can be directed to all corners of the heat sink.

The fan holder has two clips that arise from opposing edges of the backplane. The inside wall of each clip is embedded with a hook near the top and an indented trench of appropriate width that stretches from the hook down through the pilot hole to the back side of the backplane.

Multiple resilient pins are formed on the backside of the backplane extending outward with an inclined angle for coupling with the mini fan. One end of each resilient pin resembling a pillar is permanently connected to the back side of the backplane, and the other end, with a semi-circular ball head, extends outward with an inclined angle.

To set up the mini fan without using any mounting screws, the resilient pins of the fan holder are first inserted through the four corner holes of the fan until the fan holder and fan body are mutually engaged; the opposing clips on the fan subassembly are then inserted through the slot holes of the heat sink or computer chassis to allow the hooks to be engaged behind the heat sink or computer chassis. At this point, the assembling of the mini fan is completed.

The present invention is an integrated body that not only simplifies the assembling of mini fan in a computer, but also secures the mini fan in a computer to prevent vibration during the fan operation.

The design of the mini fan assembly can prevent loosening of the screws that may cause serious vibration and breakdown of the fan, and situations such as misfit screws and washed out heads. Moreover, the production and assembling costs for the fan assembly can be considerably lowered.

These along with other features of novelty which characterize the invention, are pointed out with particularity in the claims annexed to and forming a part of this disclosure. For a better understanding of the invention, the operating advantages and the specific objectives attained by its uses, references should be made to the accompanying drawings and descriptive matter illustrated in preferred embodiments of the invention.

DETAILED DESCRIPTION OF THE PREFERRED EMBODIMENT

Figure 1:
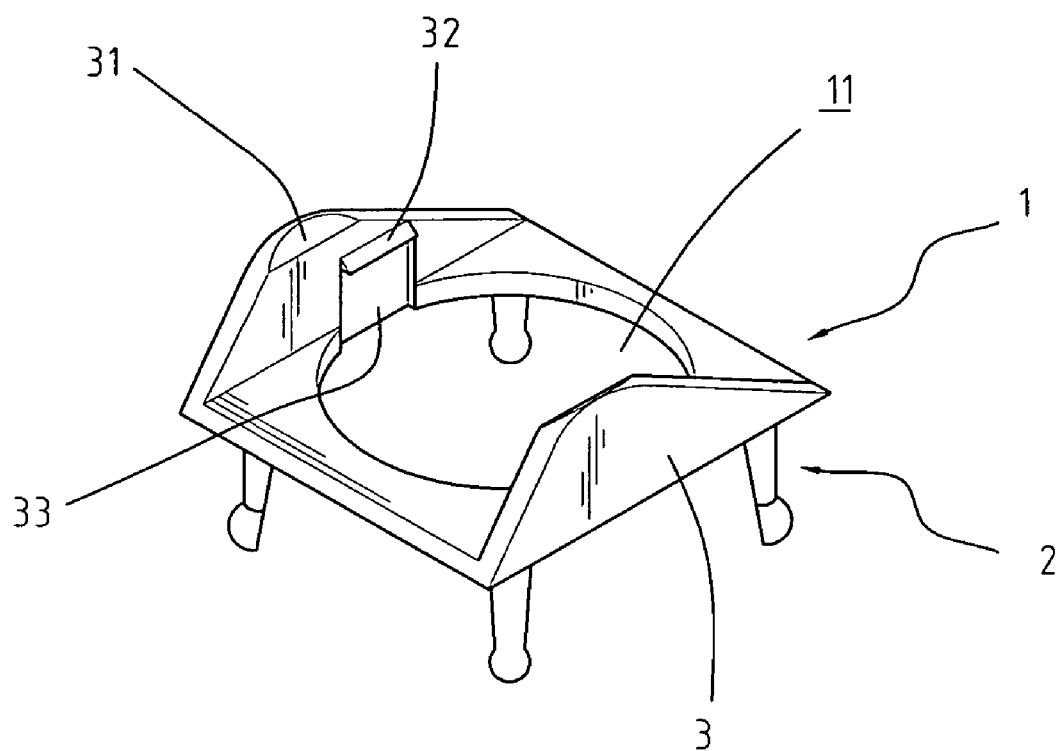
FIG. 1 is a top perspective view of the present invention.

The screwless mini fan holder as shown in FIG. 1 is installable in computers, televisions or motors. The fan holder in accordance with the preferred embodiment of the invention is put in a computer casing.

The injection molded fan holder is actually a mount bracket having a pilot hole 11 in the center of a backplane 1, through which air flow can be directed to all corners of the heat sink. The fan holder has two clips 3 extending outward from opposing edges of the backplane 1, each of which has an inward sloping guide 31 at the tip used to slide the clip 3 into corresponding slot hole 51 on the heat sink 5. The fan holder also has four resilient pins 2 on the back side of the backplane 1 used for coupling with the mini fan 4. Supposedly, the heat sink or computer chassis shall be provided with the slot holes for the mini fan assembly.

Figure 2:
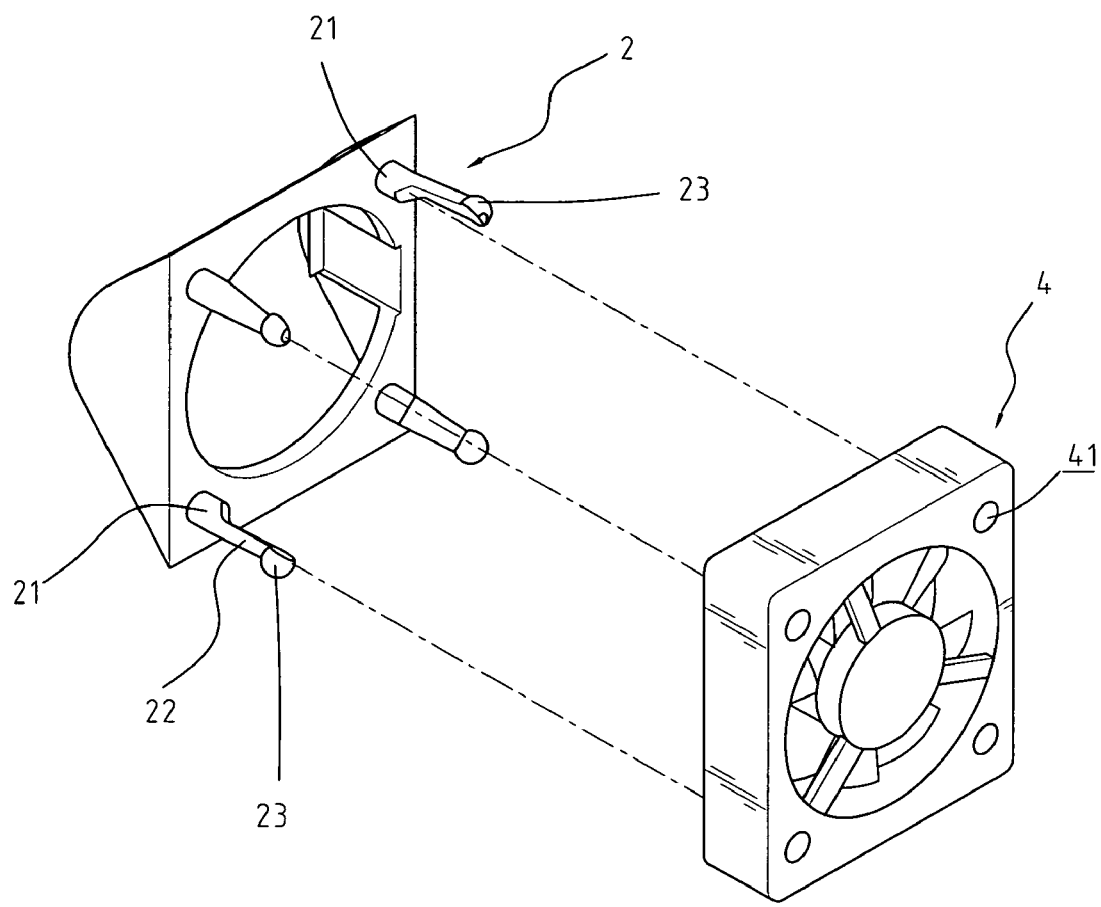
FIG. 2 is an exploded view of coupling of a mini fan and a fan holder.

Referring to FIG. 2, multiple resilient pins 2 are formed at four corners of the backplane 1 extending outward at an inclined angle. One end of each resilient pin 2 resembling a pillar is permanently connected to the back side of the backplane 1, and the other end extends outward with a semi-circular ball head 23 on end. The corner of each resilient pin 2 facing the center hole 11 is planarized. The shape of the backplane 1 may be square or quadrangular.

Figure 3:
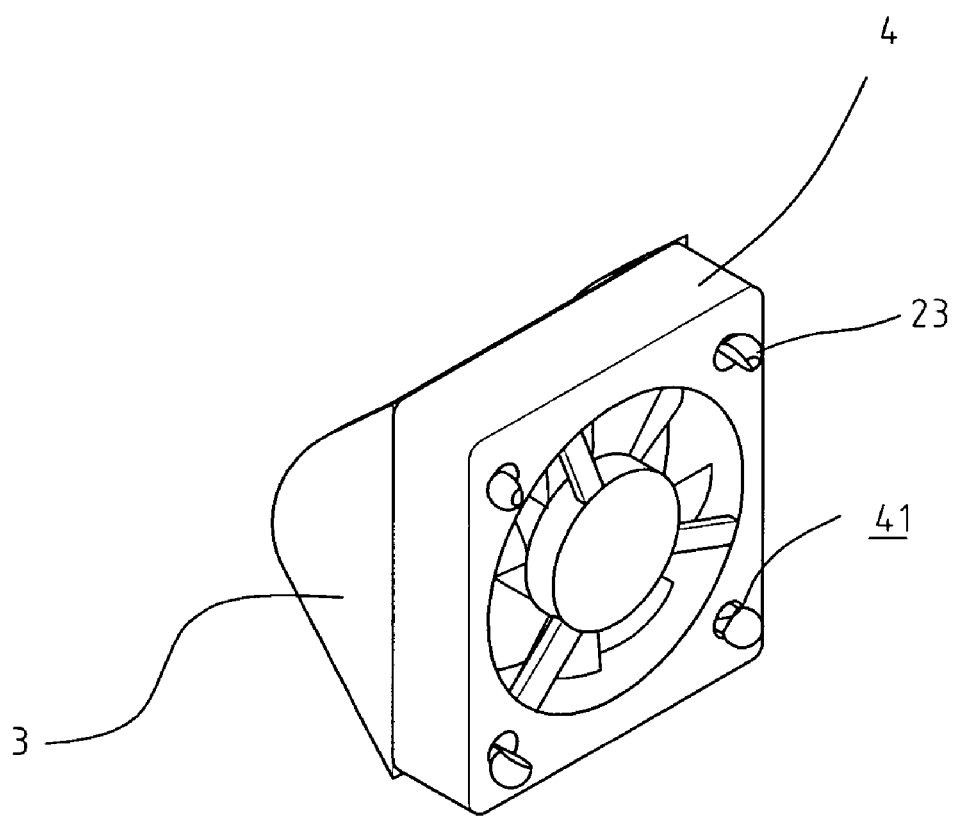
FIG. 3 is a diagram of a mini fan assembly.

Referring to FIGS. 2, 3, one end of the resilient pin 2 being connected to the back side of the backplane 1 is pillar shaped, enough to withstand stress generated by the operating fan 4 as well as the compressive force of the user's hand. Since the fan holder is made with plastic material, the resilient pin 2 possesses good flexibility to allow the semi-circular ball head 23 of the resilient pins 2 to hold the fan 4 in place after slipping pass corresponding corner holes 41 of the fan 4 as shown in FIG. 4.

Figure 4:
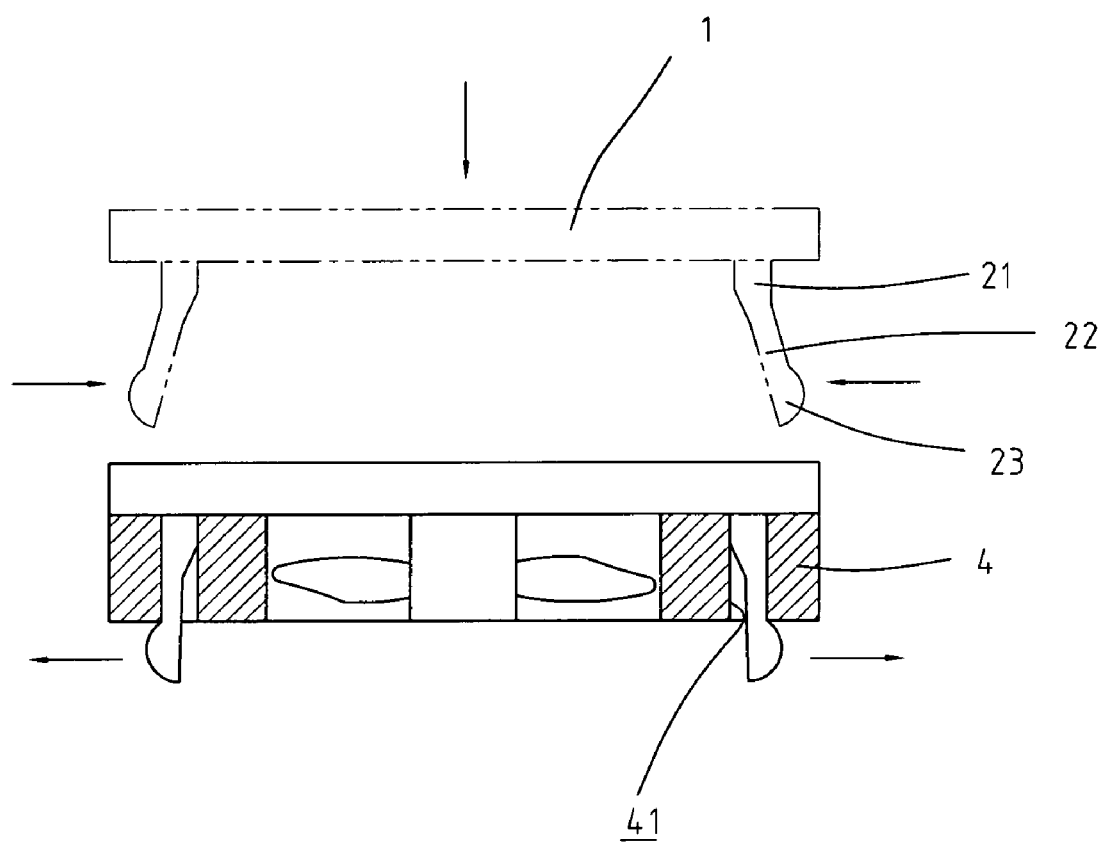
FIG. 4 is a sectional view of the structure of the fan holder and mini fan before and after coupling.

When the mini fan 4 is assembled onto the fan holder, the four resilient pins 2 lock in the mini fan 4 after slipping pass four corresponding corner holes 41 of the fan 4 to reach the back of the mini fan 4 as shown in FIG. 4.

Again referring to FIG. 1, the inside wall of the clip 3 is embedded with a hook 32 near the top, and an indented trench 33 of appropriate width that stretches from the hook 32 and pass through the pilot hole 11 to reach the back of the backplane 1.

Figure 5:
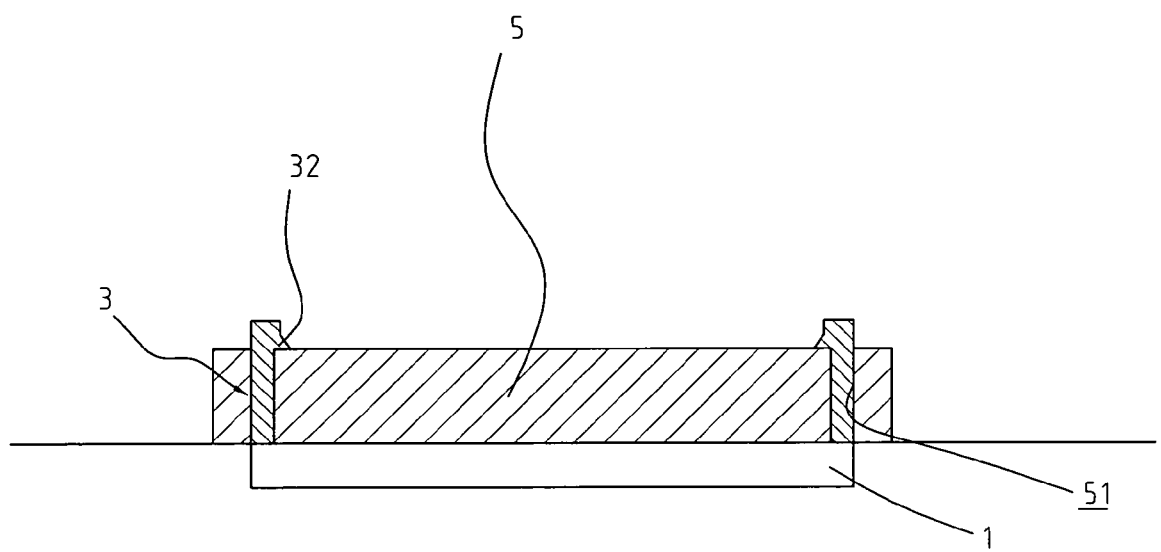
FIG. 5 is a partial view of the fan holder showing the clips inserted into the slot holes of a heat sink.
Figure 6:
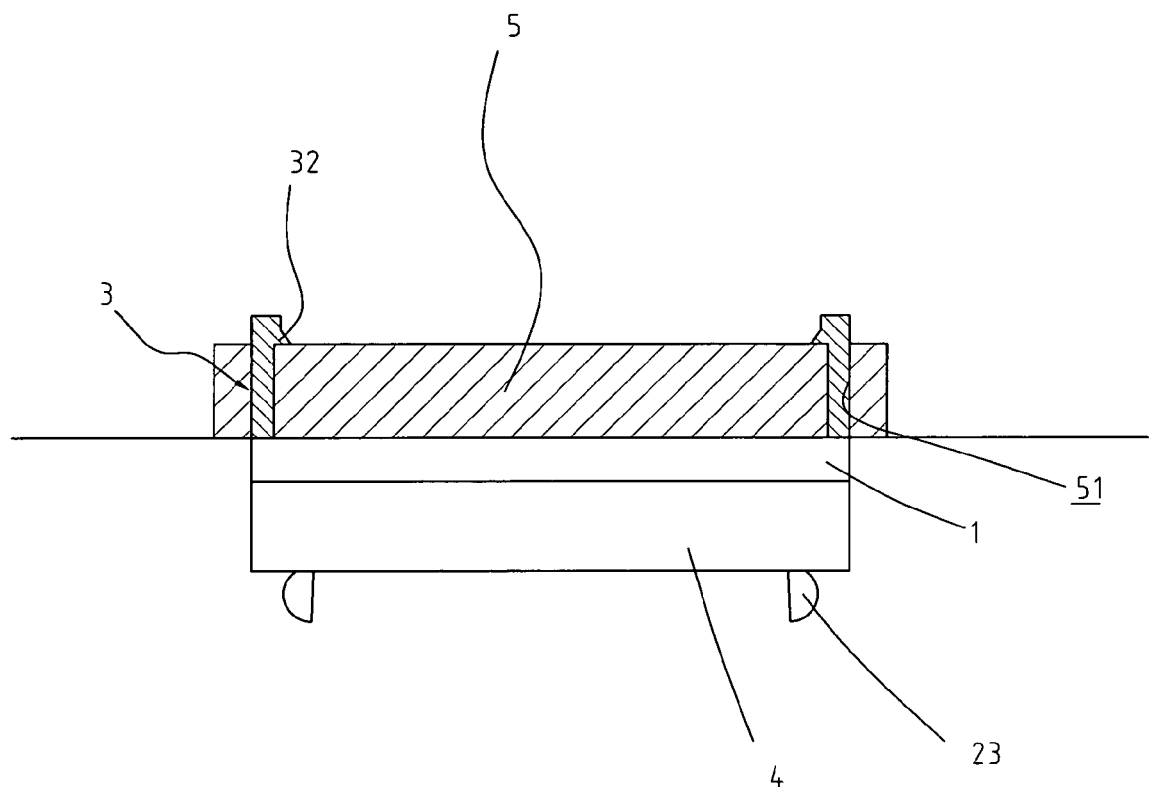
FIG. 6 is a diagram of the mini fan assembled onto the heat sink.

When the mini fan assembly is coupled onto the heat sink 5 as shown in FIG 5, the two clips 3 are inserted through corresponding slot holes 51 on the heat sink 5, so the fan assembly is locked in by the two hooks 32 from opposite sides, as shown in FIGS. 5, 6.

With such clip structure, the opposing clips 3 are able to get a firm grip on the heat sink 5, as the heat sink 5 is squarely received into the indented trenches 33 to prevent slipping of the fan assembly. This not only simplifies the assembly of mini fan in a computer, but also secures the fan assembly to prevent vibration during the fan operation.

The two clips 3 are matched up with the slot holes 51 on the heat sink. When the fan assembly is fitted onto the heat sink 5, the inward sloping guide 31 on each side slides the two clips 3 into corresponding slot hole 51 of the heat sink 5, and the hook 32 is engaged after slipping pass the slot hole 51 to reach the back of the heat sink 5, so the fan assembly is attached onto the heat sink 5 as shown in FIGS. 5, 6.

Although the present invention has been described with reference to the preferred embodiments thereof, it is apparent to those skilled in the art that a variety of modifications and changes may be made with regard to different forms and shapes without departing from the spirit and scope of the present invention which is intended to be defined by the appended claims.

What is claimed is:

1. A screwless mini fan holder, comprising:
   a backplane having a pilot hole in a center for passing airflow to a heat sink;
   two clips formed respectively on two opposing edges of a front side of the backplane, each of the two clips having an inside wall embedded with a hook and an indented trench for locking the fan holder onto the heat sink; and
   a plurality of resilient pins formed on a back side of the backplane, each of the resilient pins being pillar-shaped and extending outward from the backplane;
   wherein each clip has an inward sloping guide at a tip for sliding the clip into a corresponding slot hole on the heat sink.

2. The screwless mini fan holder as claimed in claim 1, wherein the indented trench of each clip stretches from the corresponding hook down through the pilot hole to the back side of the backplane.

3. The screwless mini fan holder as claimed in claim 1, wherein each resilient pin has one side facing the pilot hole planarized.

4. The screwless mini fan holder as claimed in claim 1, wherein each resilient pin extends outward from a respective corner of the backplane at an inclined angle.

5. The screwless mini fan holder as claimed in claim 1, wherein each resilient pin has a free end formed with a semi-circular ball head.

6. The screwless mini fan holder as claimed in claim 1, wherein the backplane is square shaped.

7. The screwless mini fan holder as claimed in claim 1, wherein the backplane is quadrangular.

8. The screwless mini fan holder as claimed in claim 1, wherein the backplane has a circular pilot hole in the center.

9. A screwless mini fan holder, comprising:
   a backplane having a pilot hole in a center for passing airflow to a heat sink;
   two clips formed respectively on two opposing edges of a front side of the backplane, each of the two clips having an inside wall embedded with a hook and an indented trench for locking the fan holder onto the heat sink; and
   a plurality of resilient pins formed on a back side of the backplane, each of the resilient pins being pillar-shaped and extending outward from the backplane;
   wherein the indented trench of each clip stretches from the corresponding hook down through the pilot hole to the back side of the backplane.

10. The screwless mini fan holder as claimed in claim 9, wherein each resilient pin has one side facing the pilot hole planarized.

11. The screwless mini fan holder as claimed in claim 9, wherein each resilient pin extends outward from a respective corner of the backplane at an inclined angle.

12. The screwless mini fan holder as claimed in claim 9, wherein each resilient pin has a free end formed with a semi-circular ball head.

13. The screwless mini fan holder as claimed in claim 9, wherein the backplane is square shaped.

14. The screwless mini fan holder as claimed in claim 9, wherein the backplane is quadrangular.

15. The screwless mini fan holder as claimed in claim 9, wherein the backplane has a circular pilot hole in the center.

* * * * *